(12) United States Patent
Zeng et al.

(10) Patent No.: US 11,646,223 B2
(45) Date of Patent: May 9, 2023

(54) METAL LEAD, SEMICONDUCTOR DEVICE AND METHODS OF FABRICATING THE SAME

(71) Applicant: WUHAN XINXIN SEMICONDUCTOR MANUFACTURING CO., LTD., Hubei (CN)

(72) Inventors: Tian Zeng, Hubei (CN); Xing Hu, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 52 days.

(21) Appl. No.: 16/977,704

(22) PCT Filed: Mar. 17, 2020

(86) PCT No.: PCT/CN2020/079615
§ 371 (c)(1),
(2) Date: Sep. 2, 2020

(87) PCT Pub. No.: WO2021/093238
PCT Pub. Date: May 20, 2021

(65) Prior Publication Data
US 2021/0175117 A1    Jun. 10, 2021

(30) Foreign Application Priority Data
Nov. 11, 2019 (CN) .......................... 201911095493.0

(51) Int. Cl.
*H01L 23/522* (2006.01)
*H01L 21/768* (2006.01)
(Continued)

(52) U.S. Cl.
CPC ...... *H01L 21/76816* (2013.01); *H01L 21/486* (2013.01); *H01L 21/76877* (2013.01); *H01L 23/528* (2013.01); *H01L 23/5226* (2013.01)

(58) Field of Classification Search
CPC ..... H01L 21/48; H01L 21/486; H01L 21/768; H01L 21/76816; H01L 21/76877;
(Continued)

(56) References Cited

U.S. PATENT DOCUMENTS 5,717,251 A    2/1998 Hayashi et al.
7,855,142 B2 * 12/2010 Oh .................... H01L 21/76811
                                                       438/634

(Continued)

FOREIGN PATENT DOCUMENTS

CN    104319258 A    1/2015
CN    109449091 A    3/2019
(Continued)

*Primary Examiner* — Chuong A Luu
(74) *Attorney, Agent, or Firm* — Muncy, Geissler, Olds & Lowe, P.C.

(57) ABSTRACT

A metal lead, a semiconductor device and method of fabricating the same are disclosed, in which a first trench is formed simultaneously with a wiring layer trench, followed by the formation of a second trench in communication with the first trench. After that, a conductive structure is formed simultaneously with a wiring layer by filling a conductive material simultaneously in the first, second and wiring layer trenches. In this way, it is neither necessary to externally connect the conductive structure by forming an additional opening, nor to form the wiring layer by etching a deposited aluminum layer. This saves the use of two photomasks, leading to savings in production cost.

9 Claims, 10 Drawing Sheets

(51) Int. Cl.
*H01L 21/48* (2006.01)
*H01L 23/528* (2006.01)

(58) Field of Classification Search
CPC . H01L 23/522; H01L 23/528; H01L 23/5226; H01L 23/48; H01L 23/481; H01L 25/00; H01L 25/50; H01L 27/06; H01L 27/0688; H01L 21/76807; H01L 21/76831; H01L 21/76898; H01L 2224/9202; H01L 2225/06524; H01L 2225/06544
USPC ................................................ 257/774
See application file for complete search history.

(56) References Cited

U.S. PATENT DOCUMENTS

| | | | |
|---|---|---|---|
| 9,117,804 B2* | 8/2015 | Kuo | H01L 23/147 |
| 2003/0020169 A1* | 1/2003 | Ahn | H01L 21/76874 |
| | | | 257/E21.174 |
| 2014/0264709 A1* | 9/2014 | Tsai | H01L 23/5226 |
| | | | 438/26 |
| 2014/0264862 A1* | 9/2014 | Tsai | H01L 23/481 |
| | | | 257/774 |
| 2014/0264947 A1* | 9/2014 | Lin | H01L 24/80 |
| | | | 438/455 |
| 2018/0366447 A1 | 12/2018 | Tsai et al. | |

FOREIGN PATENT DOCUMENTS

| | | |
|---|---|---|
| CN | 109698133 A | 4/2019 |
| CN | 110828372 A | 2/2020 |
| JP | 2000077407 A | 3/2000 |

\* cited by examiner

METAL LEAD, SEMICONDUCTOR DEVICE AND METHODS OF FABRICATING THE SAME

TECHNICAL FIELD

The present invention relates to the fabrication of semiconductor devices and, in particular, to a metal lead, a semiconductor device and methods of fabricating the same.

BACKGROUND

Currently, most of the three-dimensional integrated circuits (3D IC) fabrication processes utilize the TSV (Through Silicon Via). TSV technology is a new packaging technology to incorporate a number of chips in a single package, in which through vias filled with a conductive material are formed in the chips' substrates or wafers, and the chips or wafers are stacked one above another, with the vias electrically connecting the chips together. The TSV technology allows the three-dimensional stacking of chips with a maximized density, the most compact overall size and significantly improved speed and power consumption performance.

Conventionally, when such a TSV process is followed by an additional wiring process, the traditional process is to continue to deposit a silicon nitride/oxide (SiN/OX) layer over the TSV structures and then expose the TSV structures by forming depressions, followed by AL (aluminum) deposition and the final formation of a wiring layer. However, this process requires the use of at least two masks, leading to high cost.

Therefore, there is a need to develop a new fabrication method that can address the above problem.

SUMMARY OF THE INVENTION

In view of the above problem, it is an objective of the present invention to provide a metal lead, a semiconductor device and methods of fabricating the same, which allow the simultaneous formation of a conductive structure and a wiring layer without the use of additional masks and thereby resulting in cost savings.

The above objective is attained by a method of fabricating a metal lead, which includes:

providing a semiconductor substrate and simultaneously forming therein a first trench and a wiring layer trench, wherein each of the first trench and the wiring layer trench extends from a surface of the semiconductor substrate into the semiconductor substrate;

forming a second trench, which extends from the surface of the semiconductor substrate into the semiconductor substrate and communicates with the first trench; and forming a conductive structure and a wiring layer by filling the first trench, the second trench and the wiring layer trench with a conductive material.

Optionally, in the method of fabricating a metal lead, a depth of the second trench extending from the surface of the semiconductor substrate into the semiconductor substrate may be greater than a depth of the first trench extending from the surface of the semiconductor substrate into the semiconductor substrate, and wherein the first trench and the second trench together form a Damascus structure.

Optionally, in the method of fabricating a metal lead, the first trench may have a depth equal to a depth of the wiring layer trench.

Optionally, in the method of fabricating a metal lead, the second trench may have an opening size smaller than an opening size of the first trench.

Optionally, in the method of fabricating a metal lead, a projection of the first trench on the surface of the semiconductor substrate may encompass a projection of the second trench on the surface of the semiconductor substrate.

The above objective is also attained by a method of semiconductor device, which includes:

providing a first semiconductor and a second semiconductor bonded to the first semiconductor, the second semiconductor bonded to the first semiconductor and forming a bonding interface at a bonding position, the first semiconductor including a first substrate, a first interlayer dielectric layer on a front side of the first substrate and a first conductive layer embedded in the first interlayer dielectric layer, the second semiconductor including a second substrate, a second interlayer dielectric layer on a front side of the second substrate and a second conductive layer embedded in the second interlayer dielectric layer, wherein a third interlayer dielectric layer is formed on a side of the second semiconductor away from the bonding interface;

simultaneously forming a first trench and a wiring layer trench, the first trench and the wiring layer trench respectively formed in the third interlayer dielectric layer;

forming a first opening extending through the third interlayer dielectric layer and a partial thickness of the second semiconductor, the first opening situated above the second conductive layer, the first opening in communication with the first trench;

forming a second opening extending through the third interlayer dielectric layer, the second semiconductor and a partial thickness of the first semiconductor, the second opening situated above the first conductive layer, the second opening in communication with the first trench;

exposing the first conductive layer beneath the second opening and the second conductive layer beneath the first opening; and forming a conductive structure and a wiring layer by filling the first trench, the first opening, the second opening and the wiring layer trench with a conductive material.

Optionally, in this method of fabricating a semiconductor device, the first opening may have an opening size smaller than an opening size of the first trench, wherein a projection of the first trench on a surface of the third interlayer dielectric layer encompasses a projection of the first opening on the surface of the third interlayer dielectric layer.

Optionally, in this method of fabricating a semiconductor device, the second opening may have an opening size smaller than the opening size of the first opening, wherein the projection of the first opening on the surface of the third interlayer dielectric layer encompasses a projection of the second opening on the surface of the third interlayer dielectric layer.

Optionally, this method of fabricating a semiconductor device may further include, subsequent to the formation of the first opening and prior to the formation of the second opening, forming an insulating layer covering sidewalls and bottom surfaces of the first trench, the first opening and the wiring layer trench.

Optionally, in this method of fabricating a semiconductor device, during exposing the first conductive layer beneath the second opening and the second conductive layers beneath the first opening, the wiring layer trench may be located in the third interlayer dielectric layer.

The above objective is also attained by a metal lead formed in a semiconductor substrate, which includes:

a wiring layer trench, which extends from a surface of the semiconductor substrate into the semiconductor substrate;

a first trench, which extends from the surface of the semiconductor substrate into the semiconductor substrate and is formed simultaneously with the wiring layer trench;

a second trench, which extends from the surface of the semiconductor substrate into the semiconductor substrate and communicates with the first trench;

a conductive structure filling the first and second trenches; and a wiring layer filling the wiring layer trench.

Optionally, in the metal lead, first trench may have a depth equal to a depth of the wiring layer trench.

Optionally, in the metal lead, the second trench may have an opening size smaller than an opening size of the first trench.

Optionally, in the metal lead, a projection of the first trench on the surface of the semiconductor substrate may encompass a projection of the second trench on the surface of the semiconductor substrate.

The above objective is also attained by a semiconductor device including:

a first semiconductor and a second semiconductor bonded to the first semiconductor, the second semiconductor bonded to the first semiconductor and forming a bonding interface at a bonding position, the first semiconductor including a first substrate, a first interlayer dielectric layer on a front side of the first substrate and a first conductive layer embedded in the first interlayer dielectric layer, the second semiconductor including a second substrate, a second interlayer dielectric layer on a front side of the second substrate and a second conductive layer embedded in the second interlayer dielectric layer, wherein a third interlayer dielectric layer is formed on the side of the second semiconductor away from the bonding interface;

a wiring layer trench in the third interlayer dielectric layer;

a first trench in the third interlayer dielectric layer, the first trench formed simultaneously with the wiring layer trench;

a first opening extending through the third interlayer dielectric layer and a partial thickness of the second semiconductor, the first opening situated above the second conductive layer so that the second conductive layer are exposed in the first opening, the first opening in communication with the first trench;

a second opening extending through the third interlayer dielectric layer, the second semiconductor and a partial thickness of the first semiconductor, the second opening situated above the first conductive layer so that the first conductive layer is exposed in the second opening, the second opening in communication with the first trench;

a conductive structure formed in the first trench, the first opening and the second opening, the conductive structure connecting the first conductive layer to the second conductive layer; and a wiring layer filling the wiring layer trench.

Optionally, in the semiconductor device, the first opening may have an opening size smaller than an opening size of the first trench, wherein a projection of the first trench on a surface of the third interlayer dielectric layer encompasses a projection of the first opening on the surface of the third interlayer dielectric layer.

Optionally, in the semiconductor device, the second opening may have an opening size smaller than the opening size of the first opening, wherein the projection of the first opening on the surface of the third interlayer dielectric layer encompasses a projection of the second opening on the surface of the third interlayer dielectric layer.

Compared to the prior art, in the metal lead, the semiconductor device and the methods provided in the present invention, the first trench is formed simultaneously with the wiring layer trench, followed by the formation of the second trench in communication with the first trench. After that, the conductive structure is formed simultaneously with the wiring layer by filling the conductive material simultaneously in the first, second and wiring layer trenches. In this way, it is neither necessary to externally connect the conductive structure by forming an additional opening, nor to form the wiring layer by etching a deposited aluminum layer. This saves the use of two photomasks, leading to savings in cost.

DETAILED DESCRIPTION

FIGS. 1-8 schematically show structures resulting from various steps in a method of fabricating a semiconductor device. The method of fabricating a semiconductor device will now be described in detail below with reference to FIGS. 1-8.

Figure 1:
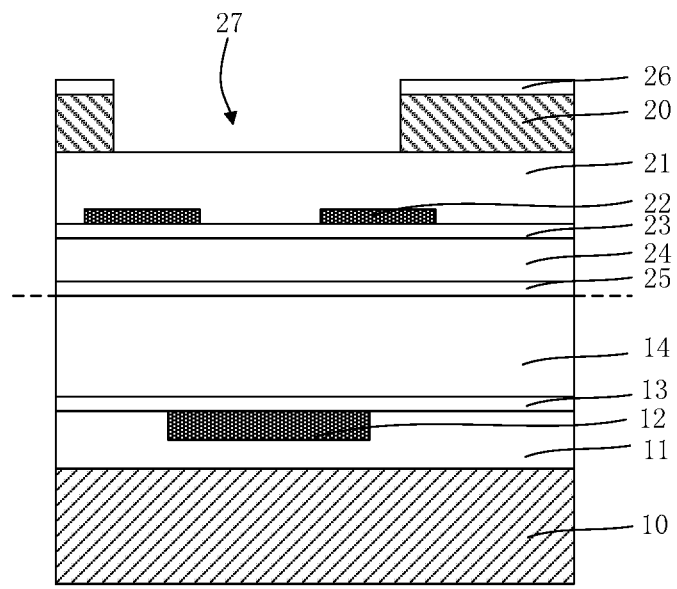
FIGS. 1-8 schematically show structures resulting from various steps in a method of fabricating a semiconductor device.

At first, as shown in FIG. 1, a first substrate 10 and a second substrate 20 are provided. A first interlayer dielectric layer 11 is formed on the first substrate 10 and the first interlayer dielectric layer 11 is etched to form therein a recess, in which a metallic material is then filled, thereby forming a first conductive layer 12. Then, a first barrier layer 13 is formed, both the first interlayer dielectric layer 11 and the first conductive layer 12 are covered by the first barrier layer 13, a second interlayer dielectric layer 14 is then formed on the first barrier layer 13. At the same time, a third interlayer dielectric layer 21 is formed on one side of the second substrate 20 and the third interlayer dielectric layer 21 is etched to form therein recesses, in which a metallic material is then filled, thereby forming second conductive layers 22. In this embodiment, two second conductive layers 22 are formed, and after the first substrate 10 is subsequently bonded to the second substrate 20, projections of these second conductive layers 22 on the first interlayer dielectric layer 11 each have an overlap with the first conductive layer 12. Afterward, a second barrier layer 23 is formed, both the third interlayer dielectric layer 21 and the second conductive layers 22 are covered by the second barrier layer 23, and a fourth interlayer dielectric layer 24 is then formed on the second barrier layer 23. At last, a third barrier layer 25 is formed on the fourth interlayer dielectric layer 24. Of course, the third barrier layer may be alternatively formed on the second interlayer dielectric layer 14. After that, the side of the first substrate 10 formed with the third dielectric layer 14 is bonded to the side of the second substrate 20 formed with the third barrier layer 25.

In addition, a fifth interlayer dielectric layer 26 is formed on the side of the second substrate 20 opposite to the bonded side thereof. The fifth interlayer dielectric layer 26 may be formed either before or after the bonding. All the interlayer dielectric layers may be preferably formed of silicon oxide, and all the barrier layers may be preferably formed of silicon nitride.

Subsequently, with continued reference to FIG. 1, a first trench 27 is formed by successively etching the fifth interlayer dielectric layer 26 and the second substrate 20. A projection of the first trench 27 on the third interlayer dielectric layer 21 overlaps part of each of the adjacent two second conductive layers 22.

Figure 2:
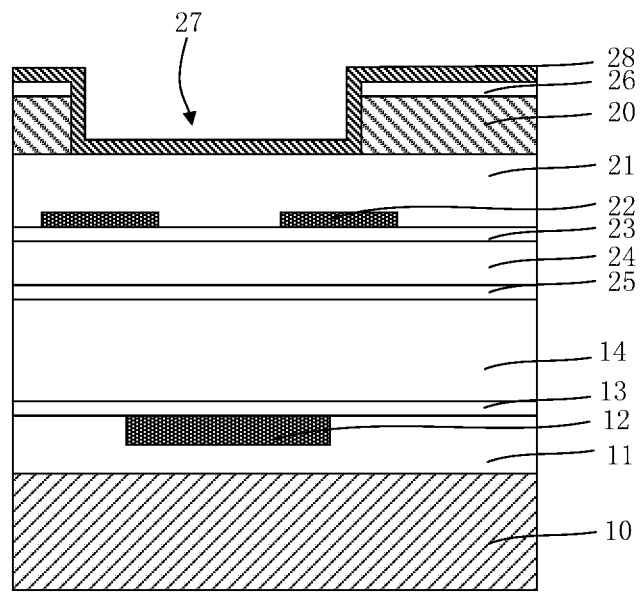

Referring now to FIG. 2, an insulating layer 28 is formed, the fifth interlayer dielectric layer 26, as well as both a sidewall and a bottom surface of the first trench 27 are covered by the insulating layer 28. Example materials from which the insulating layer 28 can be formed may include, but are not limited to, silicon oxide.

Figure 3:
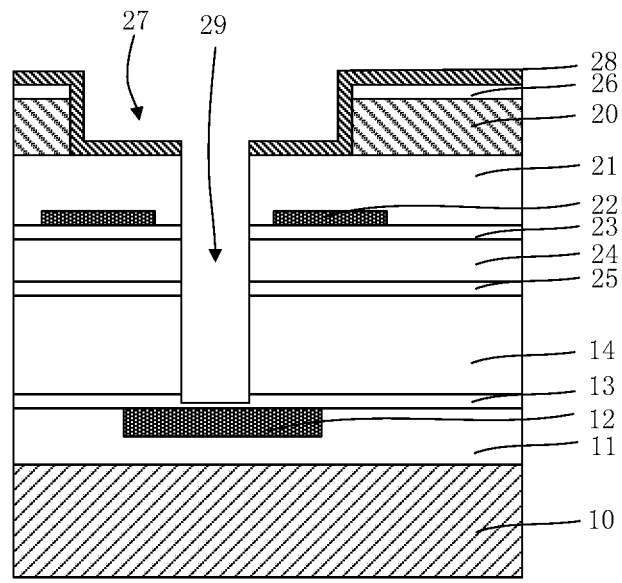

Referring now to FIG. 3, an etching process is performed in the first trench 27 to form an opening 29 that sequentially extends through the insulating layer 28, the third interlayer dielectric layer 21, the second barrier layer 23, the fourth interlayer dielectric layer 24, the third barrier layer 25, the second interlayer dielectric layer 14 and a partial thickness of the first barrier layer 13. The opening 29 has an opening size smaller than an opening size of the first trench 27 and the opening 29 is located above the first conductive layer 12 and close to the first conductive layer 12, and each adjacent two second layer conductive layers 22 are located on both sides of the opening 29. The first conductive layer 12 is not exposed in the opening 29 because the first conductive layer 12 is still covered by the remaining thickness of the first barrier layer 13. In this way, oxidation of the first conductive layer 12 is avoided.

Figure 4:
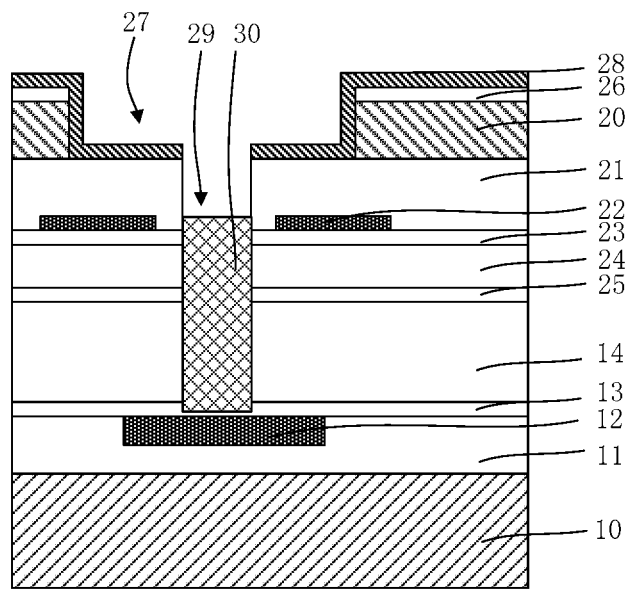

Next, referring to FIG. 4, an anti-reflective layer 30 is filled in the opening 29. Filling the anti-reflective layer 30 in the opening 29 can, on the one hand, improve surface smoothness of the first trench 27 to facilitate exposure and development of photoresist for the subsequent formation of a second trench 31 and, on the other hand, prevent the remaining barrier layer 13 on the first conductive layer 12 from being etched away during the subsequent formation of the second trench 31, i.e., preventing early exposure of the first conductive layer 12. In generally, the filled anti-reflective layer 30 is etched back so that, as shown in FIG. 4, the anti-reflective layer 30's upper surface is flush with those of the second conductive layers 12, in order to facilitate the formation of the second trench 31.

Figure 5:
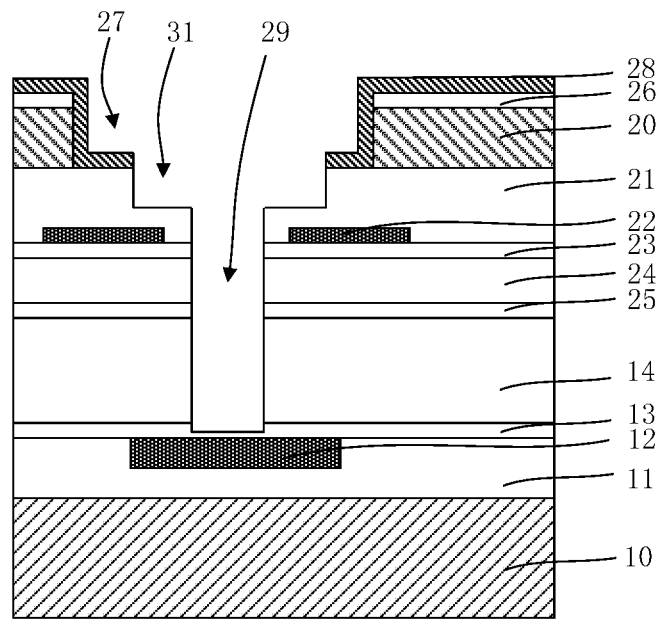

Following that, as shown in FIG. 5, an upper thickness of a portion of the third interlayer dielectric layer 21 surrounding an upper edge of the opening 29 in the first trench 27 is removed to form a second trench 31 at the bottom of the first trench 27 and on top of the opening 29. The second trench 31 has an opening size smaller than that of the first trench 27 and the opening size of the second trench 31 is greater than the opening size of the opening 29. Additionally, a bottom surface of the second trench 31 is close to the second conductive layers 22. The anti-reflective layer 30 is then removed.

The second conductive layers 22 are not exposed in the second trench 31 because the second conductive layers 22 are still covered by the remaining thickness of the third interlayer dielectric layer 21. In this way, oxidation of the second conductive layers 22 is avoided.

Figure 6:
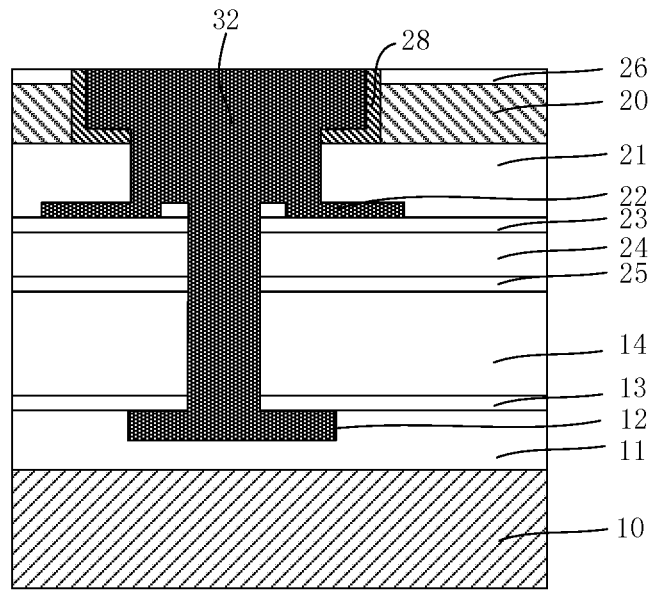

After that, referring to FIG. 6, the first conductive layer 12 and the second conductive layers 22 are both exposed, that is, the first conductive layer 12 is exposed by etching away the remaining thickness of the first barrier layer 13 at the bottom of the opening 29 and the second conductive layers 22 is exposed by etching away the remaining thickness of the third interlayer dielectric layer 21 at the bottom of the second trench 31. A conductive structure 32 is then formed by filling the first trench, the second trench and the opening with a conductive material, the conductive structure 32 connects the first conductive layer 12 to the second conductive layers 22.

Figure 7:
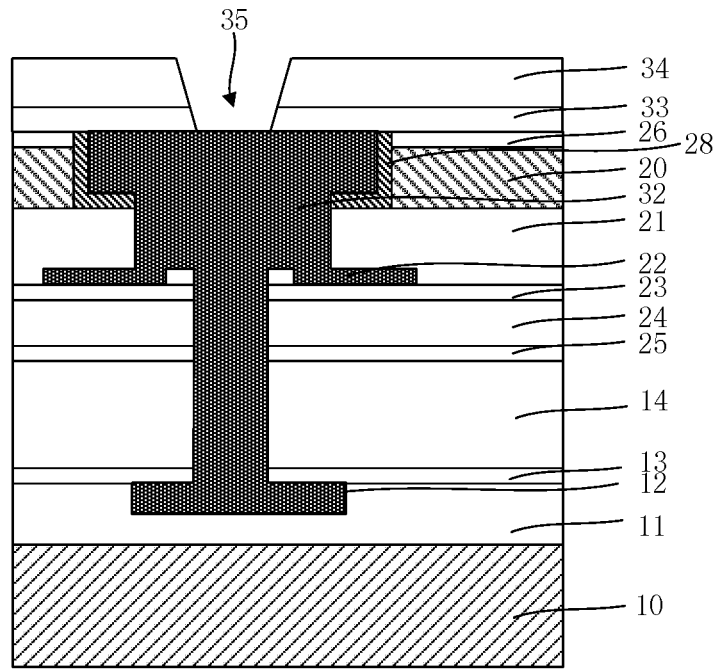

Afterward, referring to FIG. 7, a silicon nitride layer 33 and a silicon oxide layer 34 are successively formed, the silicon nitride layer 33 covering the fifth interlayer dielectric layer 26 and the conductive structure 32, and the silicon oxide layer 34 covering the silicon nitride layer 33. Then, a photoresist layer (not shown) is formed on the silicon oxide layer 34 and patterned using a photomask, and a third depression 35, in which the conductive structure 32 is exposed, is formed by sequentially etching the silicon oxide layer 34 and the silicon nitride layer 33, with the patterned photoresist layer serving a mask, followed by removal of the patterned photoresist layer. The etching process in this step requires the use of one photomask.

Figure 8:
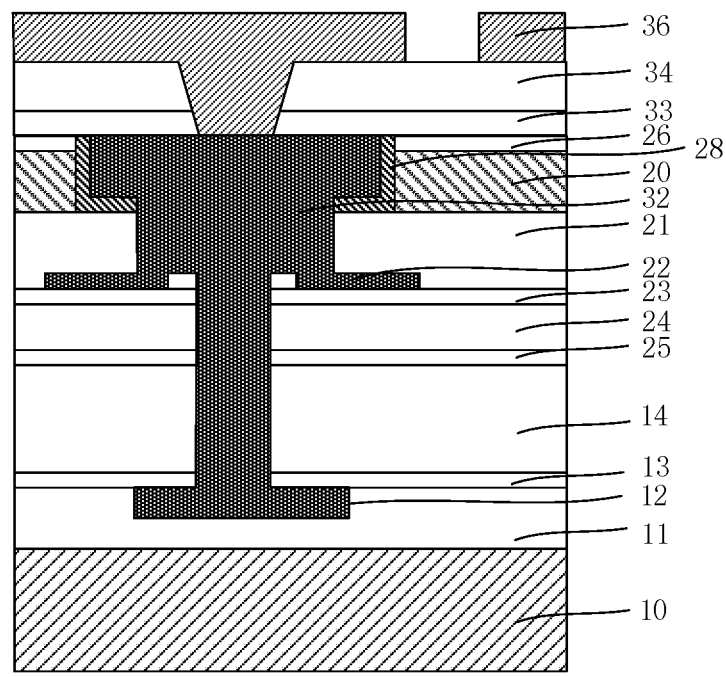

At last, referring to FIG. 8, a conductive layer, preferably an aluminum layer, is deposited, which fills the third depression 35 and covers the silicon oxide layer 34. Then, a photoresist layer (not shown) is formed on the conductive layer and patterned using a photomask, and the conductive layer is etched with the patterned photoresist layer serving as a mask. The patterned conductive layer forms a wiring layer 36. This step requires the use of another photomask.

Therefore, the part of this process subsequent to the formation of the conductive structure 32 requires the use of two photomasks, one for forming the third depression 35 that allows external connection of the conductive structure 32 and the other for patterning the conductive layer to form the wiring layer 36, making the whole process costly.

In view of this problem, the present invention provides a method of fabricating a metal lead, which includes: providing a semiconductor substrate and simultaneously forming therein a first trench and a wiring layer trench, wherein each of the first trench and the wiring layer trench extends from a surface of the semiconductor substrate into the semiconductor substrate; forming a second trench, which extends from the surface of the semiconductor substrate into the semiconductor substrate and communicates with the first trench; and forming a conductive structure and a wiring layer by filling the first trench, the second trench and the wiring layer trench with a conductive material.

Accordingly, the present invention also provides a method of fabricating a semiconductor device, which includes: providing a first semiconductor and a second semiconductor, which are bonded to each other at a bonding interface, the first semiconductor including a first substrate, a first interlayer dielectric layer on a front side of the first substrate and a first conductive layer embedded in the first interlayer dielectric layer, the second semiconductor including a second substrate, a second interlayer dielectric layer on a front side of the second substrate and second conductive layers embedded in the second interlayer dielectric layer, wherein a third interlayer dielectric layer is formed on the side of the second semiconductor away from the bonding interface; simultaneously forming a first trench and a wiring layer trench in the third interlayer dielectric layer; forming a first opening, which extends through the third interlayer dielectric layer and a partial thickness of the second semiconductor, the first opening situated above the second conductive layers, the first opening in communication with the first trench; forming a second opening, which extends through the third interlayer dielectric layer, the second semiconductor and a partial thickness of the first semiconductor, the second opening situated above the first conductive layer, the second opening in communication with the first trench; exposing the first conductive layer beneath the second opening and the second conductive layers beneath the first opening; and forming a conductive structure and a wiring layer by filling the first trench, the first opening, the second opening and the wiring layer trench with a conductive material.

Accordingly, the present invention also provides a metal lead formed in a semiconductor substrate, which includes: a wiring layer trench, which extends from a surface of the semiconductor substrate into the semiconductor substrate; a first trench, which extends from the surface of the semiconductor substrate into the semiconductor substrate and is formed simultaneously with the wiring layer trench; a second trench, which extends from the surface of the semiconductor substrate into the semiconductor substrate and communicates with the first trench; and a conductive structure, which is filled partially in the first trench, the first opening and the second opening to form a conductive structure that connects the first conductive layer to the second conductive layers and partially in the wiring layer trench to form a wiring layer.

Accordingly, the present invention also provides a semiconductor device including: a first semiconductor and a second semiconductor, which are bonded to each other at a bonding interface, the first semiconductor including a first substrate, a first interlayer dielectric layer on a front side of the first substrate and a first conductive layer embedded in the first interlayer dielectric layer, the second semiconductor including a second substrate, a second interlayer dielectric layer on a front side of the second substrate and second conductive layers embedded in the second interlayer dielectric layer, wherein a third interlayer dielectric layer is formed on the side of the second semiconductor away from the bonding interface; a wiring layer trench in the third interlayer dielectric layer; a first trench in the third interlayer dielectric layer, the first trench formed simultaneously with the wiring layer trench; a first opening, which extends through the third interlayer dielectric layer and a partial thickness of the second semiconductor, the first opening situated above the second conductive layers so that the second conductive layers are exposed in the first opening, the first opening in communication with the first trench; a second opening, which extends through the third interlayer dielectric layer, the second semiconductor and a partial thickness of the first semiconductor, the second opening situated above the first conductive layer so that the first conductive layer is exposed in the second opening, the second opening in communication with the first trench; and a conductive structure, which is filled partially in the first trench, the first opening and the second opening to form a conductive structure that connects the first conductive layer to the second conductive layers and partially in the wiring layer trench to form a wiring layer.

In the metal lead, semiconductor device and methods provided in the present invention, the first trench is formed simultaneously with the wiring layer trench, followed by the formation of the second trench in communication with the first trench. After that, the conductive structure is formed simultaneously with the wiring layer by filling the conductive material simultaneously in the first, second and wiring layer trenches. In this way, it is neither necessary to externally connect the conductive structure by forming an additional opening, nor to form the wiring layer by etching a deposited aluminum layer. This saves the use of two photomasks, leading to savings in cost.

The present invention will become more apparent upon reading the following detailed description of a few specific embodiments with reference to the accompanying drawings. Of course, the present invention is not limited to these specific embodiments, and all general alternatives well known to those skilled in the art are also embraced within the scope of the invention.

Obviously, the disclosed embodiments are only some but not all possible embodiments of this invention. In light of the embodiments described herein, those of ordinary skill in the art can obtain all other possible embodiments without exerting any creative effort, and all these embodiments are also intended to fall within the scope of the present invention. Further, the accompanying schematic drawings are provided for the purpose of illustrating the present invention in detail and may not be drawn to scale in order to facilitate such illustration. This shall not be construed as limiting the present invention in any way.

Figure 9:
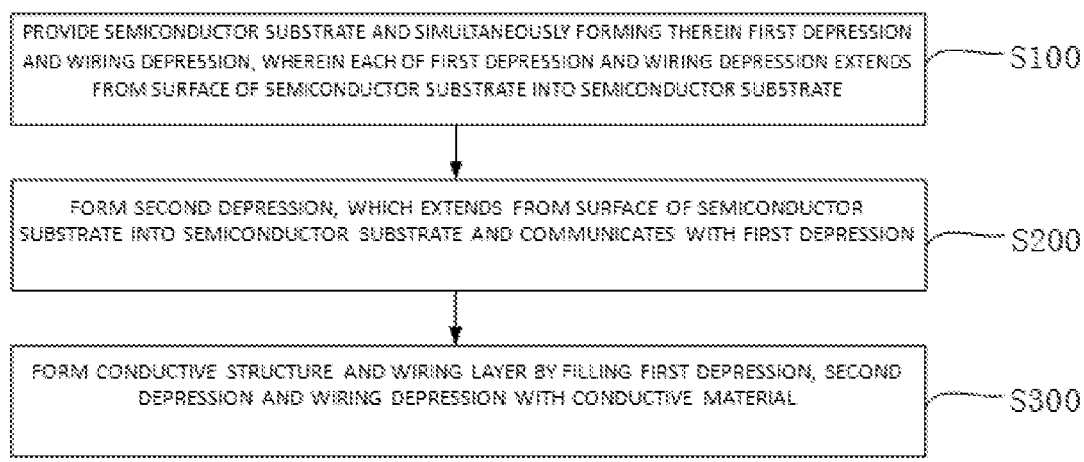
FIG. 9 is a flowchart of a method for fabricating a metal lead according to an embodiment of the present invention.
Figure 10:
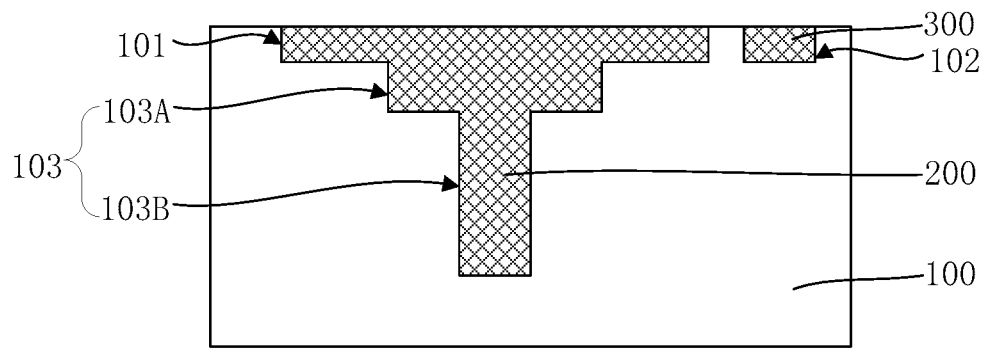
FIG. 10 is a structural schematic diagram of a metal lead according to an embodiment of the present invention.

FIG. 9 is a flowchart of a method of fabricating a metal lead according to an embodiment of the present invention. FIG. 10 is a structural schematic illustrating the method of fabricating a metal lead according to an embodiment of the present invention. The steps in the method of fabricating a metal lead according to an embodiment of the present invention will be described in detail below with reference to FIGS. 9 and 10.

In step S100, a semiconductor substrate 100 is provided, a first trench 101 is formed in the semiconductor substrate 100 simultaneously with a wiring layer trench 102. Each of the first trench 101 and the wiring layer trench 102 extends from a surface of the semiconductor substrate into the semiconductor substrate. Preferably, the first trench 101 and the wiring layer trench 102 are equally deep.

In step S200, a second trench 103 is formed. In one embodiment, the second trench 103 extends from the surface of the semiconductor substrate 100 into the semiconductor substrate 100 and communicates with the first trench 101. Preferably, the second trench 103 reaches a depth in the semiconductor substrate 100 from the surface of the semiconductor substrate 100 that is greater than a depth in the semiconductor substrate 100 from the surface of the semiconductor substrate 100 that the first trench 101 reaches, and the first trench 101 and the second trench 103 together form a Damascus structure.

In a preferred embodiment, the second trench 103 is formed at the bottom of the first trench 101 so that the first trench 101 and the second trench 103 together form a Damascus structure. For example, a photoresist layer that covers the substrate 100 and fills both the first trench 101 and the wiring layer trench 102 is formed and patterned so that a predetermined area in the first trench 101 where the second trench 103 is to be formed is exposed, and the semiconductor substrate 100 is then etched with the patterned photoresist layer serving as a mask, thereby forming the second trench 103, followed by removal of the patterned photoresist layer.

In a preferred embodiment, the second trench 103 includes a third depression 103A and an opening 103B. The third depression 103A is formed at the bottom of the first trench 101, while the opening 103B is formed at the bottom of the third depression 103A, as shown in FIG. 10. Preferably, the opening 103B has an opening size that is smaller than an opening size of the third depression 103A, the opening size of the third depression 103A is smaller than an opening size of the first trench 101. In embodiments hereof, a projection of the first trench 101 on the surface of the semiconductor substrate 100 encompasses a projection of the second trench 103 on the same surface of the semiconductor substrate 100.

In step S300, a conductive material is filled in the first trench 101, the second trench 103 and the wiring layer trench 102 so as to form a conductive structure 200 and a wiring layer 300. The conductive material filling the wiring layer trench 102 forms the wiring layer 300, and the conductive material filling the first trench 101 and the second trench 103 forms the conductive structure 200.

The semiconductor substrate 100 may include a substrate and film-like structures on at least one side of the substrate. That is to say, one or both sides of the substrate is/are provided thereon with such film-like structure(s). The substrate may be any suitable substrate well known to those skilled in the art, and examples of the film-like structure(s) may include conductive structures, gate structures, dielectric layers and the like. Examples of the conductive structures may include metal interconnect structures, resistor electrodes and capacitor electrodes, and examples of the gate structures may include polysilicon gates and metallic gates. It is to be noted that the present invention is not limited to any particular structure of the semiconductor substrate 100, and it may be suitably selected depending on the components intended to be formed thereon.

In this method of fabricating a metal lead according to the present invention, the first trench 101 is formed simultaneously with the wiring layer trench 102, followed by the formation of the second trench 103 in communication with the first trench 101. After that, the conductive structure 200 is formed simultaneously with the wiring layer 300 by filling the conductive material simultaneously in the first, second and wiring layer trenches 101, 103, 102. In this way, it is neither necessary to externally connect the conductive structure by forming an additional opening, nor to form the wiring layer by etching a deposited aluminum layer. This saves the use of two photomasks, leading to savings in cost.

Accordingly, the present invention also provides a metal lead fabricated using the method as defined above. Referring to FIG. 10, the metal lead includes:

a semiconductor substrate 100;

a wiring layer trench 102, the wiring layer trench 102 extends from a surface of the semiconductor substrate 100 into the semiconductor substrate 100;

a first trench 101, the first trench 101 extends from the surface of the semiconductor substrate 100 into the semiconductor substrate 100, and the first trench 101 is formed simultaneously with the wiring layer trench 102;

a second trench 103, the second trench 103 extends from the surface of the semiconductor substrate 100 into the semiconductor substrate 100, and the second trench 103 communicates with the first trench 101; and a conductive material, the conductive material is filled partially in the second trench 103 and the first trench 101 to form a conductive structure 200 and partially in the wiring layer trench 103 to form a wiring layer 300.

In a preferred embodiment, the second trench 103 is formed at the bottom of the first trench 101 so that the first trench 101 and the second trench 103 together form a Damascus structure. In a preferred embodiment, the second trench 103 includes a third depression 103A and an opening 103B. The third depression 103A is formed at the bottom of the first trench 101, while the opening 103B is formed at the bottom of the third depression 103A, as shown in FIG. 10. Preferably, the opening 103B has an opening size that is smaller than an opening size of the third depression 103A, the opening size of the third depression 103A is smaller than an opening size of the first trench 101.

Figure 11:
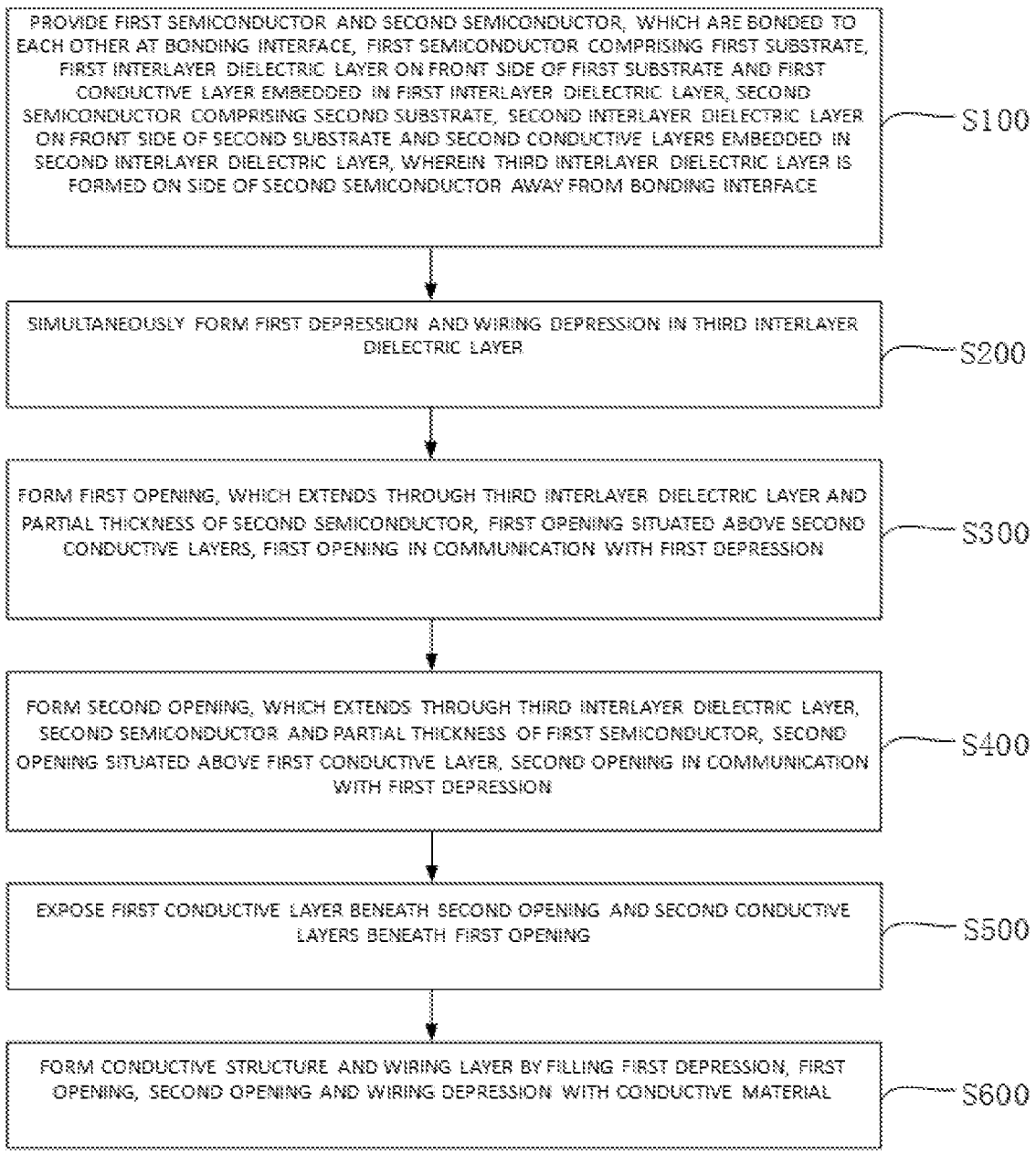
FIG. 11 is a flowchart of a method for fabricating a semiconductor device according to an embodiment of the present invention.

FIG. 11 is a flowchart of a method of fabricating a semiconductor device according to an embodiment of the present invention. FIGS. 12-17 schematically illustrate structures resulting from various steps in the method of fabricating a semiconductor device according to an embodiment of the present invention. The steps of the method of fabricating a semiconductor device according to the embodiment will be described in detail now with reference to FIG. 11 and FIGS. 12-17.

Figure 12:
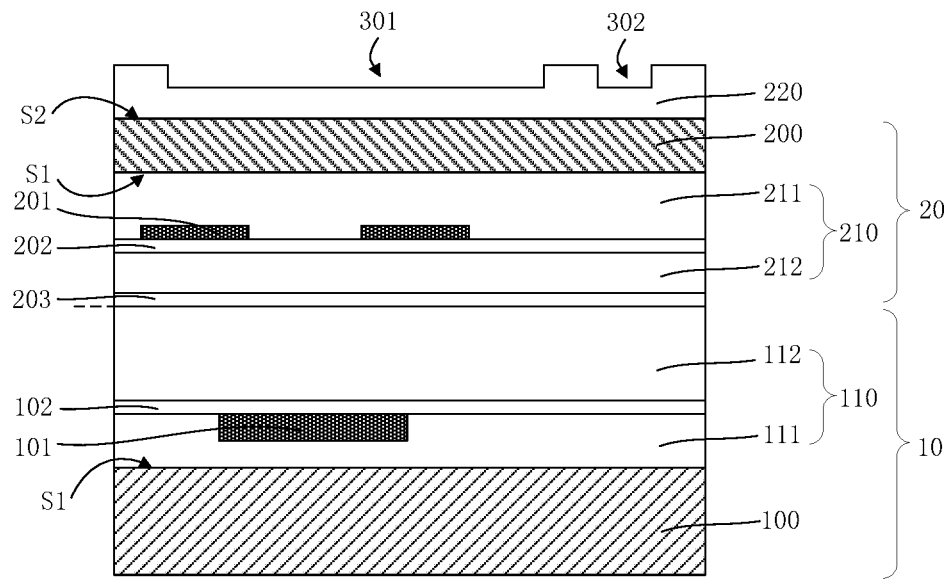
FIGS. 12-17 schematically show structures resulting from various steps in a method for fabricating a semiconductor device according to an embodiment of the present invention.

In step S100, with reference to FIGS. 11 and 12, a first semiconductor 10 and a second semiconductor 20 are provided, the first semiconductor 10 and the second semiconductor 20 are bonded together at a bonding interface. The first semiconductor 10 includes a first substrate 100, a first interlayer dielectric layer 110 on a front side S1 of the first substrate 100 and a first conductive layer 101 embedded within the first interlayer dielectric layer 110. The second semiconductor 20 includes a second substrate 200, a second interlayer dielectric layer 210 on a front side S1 of the second substrate 200 and second conductive layers 201 embedded in the second interlayer dielectric layer 210. A third interlayer dielectric layer 220 is formed on the side of the second semiconductor 20 away from the bonding interface.

Figure 18A:
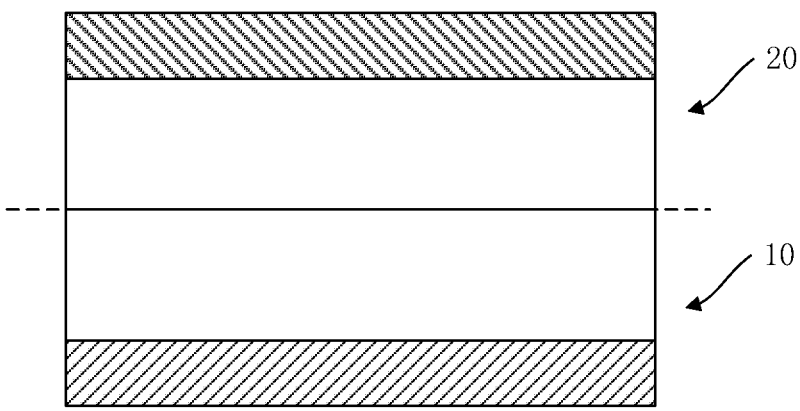
FIGS. 18a to 18c are schematic diagrams showing possible structures resulting from bonding a first semiconductor to a second semiconductor in accordance with an embodiment of the present invention.
Figure 18B:
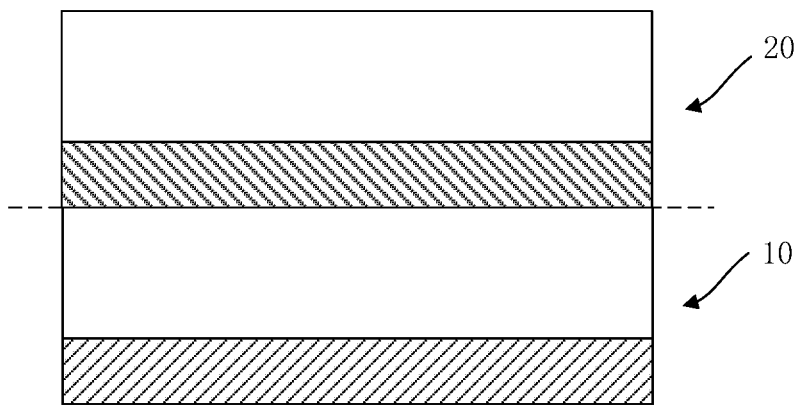
Figure 18C:
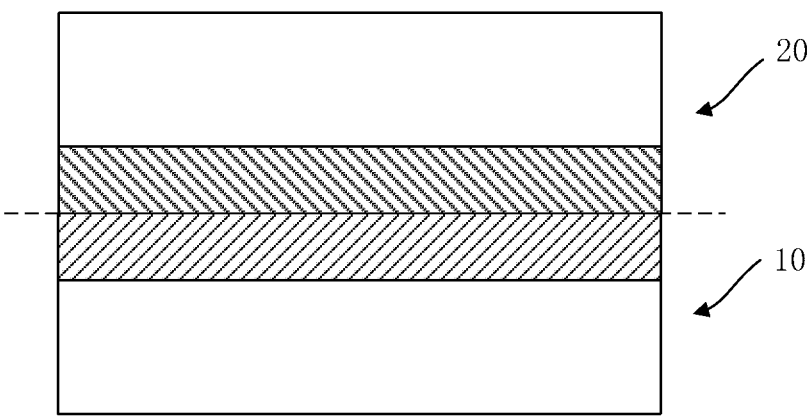

Bonding together the first and second semiconductors 10, 20 may include: bonding the front side of the first semiconductor 10 to the front side of the second semiconductor 20, as shown in FIG. 18a; or bonding the front side of the first semiconductor 10 to a back side of the second semiconductor 20, as shown in FIG. 18b; or bonding a back side of the first semiconductor 10 to the back side of the second semiconductor 20, as shown in FIG. 18c. Here, the front side of the first semiconductor 10 and the back side of the first semiconductor 10 are opposing sides, and the front side of the second semiconductor 20 and the back side of the second semiconductor 20 are opposing sides. With the bonding of the front side of the first semiconductor 10 to the front side of the second semiconductor 20 as an example, the bonding of the first semiconductor 10 to the second semiconductor 20 may include the steps of: bringing the front side of the first semiconductor 10 into aligned contact with the front side of the second semiconductor 20; applying certain pressure, temperature, voltage and other external conditions by a bonding apparatus to induce the generation of covalent, metallic, molecular or other bonds between atoms or molecules on the front sides of the first and second semiconductors 10, 20; and obtaining the bonded first and second semiconductors 10, 20 upon the process proceeding to a certain extent.

Each of the first and second substrates 100, 200 may be formed of monocrystalline silicon (Si), monocrystalline germanium (Ge), silicon germanium (GeSi) or silicon carbide (SiC), or implemented as a silicon on insulator (SOI) or germanium on insulator (GOI) substrate, or made of any other suitable material such as a III-V compound such as gallium arsenide. In this embodiment, both the first and second substrates 100, 200 are preferred to be monocrystalline silicon (Si) substrates. Various semiconductor structures such as transistors may be formed on the first and second substrates 100, 200, and the present invention is not limited in any sense in this regard.

Specifically, a first interlayer dielectric sub-layer 111 is formed on the front side S1 of the first substrate 100 and etched to form a recess in the first interlayer dielectric sub-layer 111, and a conductive material is then filled in the recess to result in the formation of the first conductive layer 101. A first barrier layer 102 is then formed, the first barrier layer 102 covers both the first conductive layer 101 and the first interlayer dielectric sub-layer 111. Afterward, a second interlayer dielectric sub-layer 112 is formed over the first barrier layer 102. Example materials from which the first and second interlayer dielectric sub-layers 111, 112 can be formed may include, but are not limited to, silicon oxide. Examples of the first conductive layer 101 may include metal interconnect structures, resistor electrodes, capacitor electrodes, etc. Example materials from which the first conductive layer 101 can be formed may include, but are not limited to, copper. Example materials from which the first barrier layer 102 can be formed may include, but are not limited to, silicon nitride.

At the same time, a third interlayer dielectric sub-layer 211 is formed on the front side S1 of the second substrate 200 and etched to form recesses in the third interlayer dielectric sub-layer 211, and a metallic material is then filled in the recesses to result in the formation of the second conductive layers 201. There are a plurality of second conductive layers 201, which are isolated by the third interlayer dielectric sub-layer 211. The number and distribution of the second conductive layers 201 can be suitably selected as desired. In a preferred embodiment, after the first and second semiconductors 10, 20 are bonded to each other, projections of the adjacent two second conductive layers 201 on the first interlayer dielectric sub-layer 111 each have an overlap with the first conductive layer 101. Next, a second barrier layer 202 is formed, the second barrier layer 202 covers both the second conductive layers 201 and the third interlayer dielectric sub-layer 211, followed by the formation of a fourth interlayer dielectric sub-layer 212 over the second barrier layer 202. Example materials from which the third and fourth interlayer dielectric sub-layers 211, 212 can be formed may include, but are not limited to, silicon oxide. Examples of the second conductive layers 201 may include metal interconnect structures, resistor electrodes, capacitor electrodes, etc. Example materials from which the second conductive layers 201 can be formed may include, but are not limited to, copper. Example materials from which the second barrier layer 202 can be formed may include, but are not limited to, silicon nitride.

At last, a third barrier layer 203 is formed over the fourth interlayer dielectric sub-layer 212. Example materials from which the third barrier layer 203 can be formed may include, but are not limited to, silicon nitride. Of course, the third barrier layer may be alternatively formed on the second interlayer dielectric sub-layer 112. After that, the first interlayer dielectric layer 110 of the first semiconductor 10, i.e., the side of the first substrate 100 with the second interlayer dielectric sub-layer 112 is boned to the second interlayer dielectric layer 210 of the second semiconductor 20, i.e., the side of the second substrate 200 with the third barrier layer 203 at the bonding interface.

The third interlayer dielectric layer 220 is formed on the side of the second semiconductor 20 away from the bonding interface, in the embodiment, the third interlayer dielectric layer 220 is formed on the back side S2 of the second substrate 200. In this embodiment, the third interlayer dielectric layer 220 may be formed either before or after the bonding. Example materials from which the third interlayer dielectric layer 220 can be formed may include, but are not limited to, silicon oxide.

In step S200, with continued reference to FIGS. 11 and 12, a first trench 301 and a wiring layer trench 302 are simultaneously formed, the first trench 301 and the wiring layer trench 302 are formed both in the third interlayer dielectric layer 220. Specifically, as shown in FIG. 12, a first photoresist layer (not shown) is formed on the third interlayer dielectric layer 220 and then patterned, and the third interlayer dielectric layer 220 is etched with the patterned first photoresist layer serving as a mask, thereby forming the first trench 301 and the wiring layer trench 302, followed by removal of the patterned first photoresist layer. Preferably, the first trench 301 and the wiring layer trench 302 are equally deep.

Figure 13:
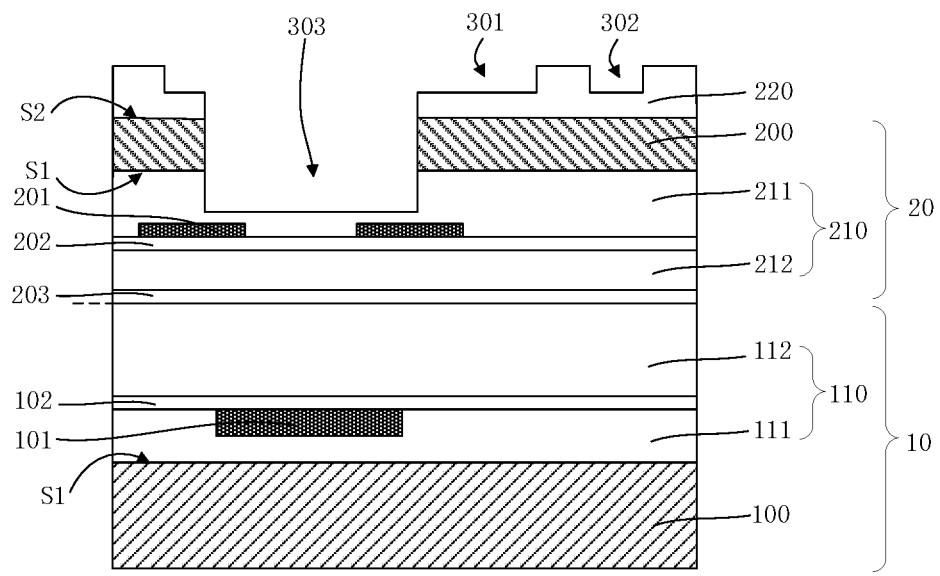

In step S300, referring to FIGS. 11 and 13, a first opening 303 is formed, the first opening 303 extends through the third interlayer dielectric layer 220 and a partial thickness of the second semiconductor 20, the first opening 303 is located above the second conductive layers 201 and close to the second conductive layers 201, and the first opening 303 communicates with the first trench 301. Specifically, as shown in FIG. 13, a second photoresist layer (not shown) is formed on the third interlayer dielectric layer 220, which covers the third interlayer dielectric layer 220 and fills both the first trench 301 and the wiring layer trench 302. The second photoresist layer is then patterned so that a predetermined bottom surface area of the first trench 301, where the first opening is to be formed, is exposed. Subsequently, the first opening 303 is formed by etching the third interlayer dielectric layer 220 and the partial thickness of the second semiconductor 20 with the patterned second photoresist layer serving as a mask, followed by removal of the patterned second photoresist layer.

In embodiments hereof, the first opening 303 has an opening size smaller than that of the first trench 301, and a projection of the first trench 301 on a surface of the third interlayer dielectric layer 220 encompasses a projection of the first opening 303 on the same surface of the third interlayer dielectric layer 220.

In a preferred embodiment, with continued reference to FIG. 13, a second photoresist layer (not shown) is formed on the third interlayer dielectric layer 220, which covers the third interlayer dielectric layer 220 and fills both the first trench 301 and the wiring layer trench 302. The second photoresist layer is then patterned so that a predetermined bottom surface area of the first trench 301, where the first opening is to be formed, is exposed. Subsequently, the first opening 303 is formed by etching the third interlayer dielectric layer 220, the second substrate 200 and a partial thickness of the second semiconductor 20 with the patterned second photoresist layer serving as a mask, followed by removal of the patterned second photoresist layer. A projection of the first opening 303 on the second interlayer dielectric layer 210 overlaps part of each of the adjacent two second conductive layers 201 so that a second opening subsequently formed by etching is located between the two second conductive layers 201, with the first opening 303 situated above the second conductive layers 201 and close to the second conductive layers 201. In addition, a projection of the first opening 303 on the first interlayer dielectric layer 110 encompasses the first conductive layer 101 so that after the second opening is subsequently formed in the first opening 303 above the first conductive layer 101, the first conductive layer 101 is exposed in the second opening.

Figure 14:
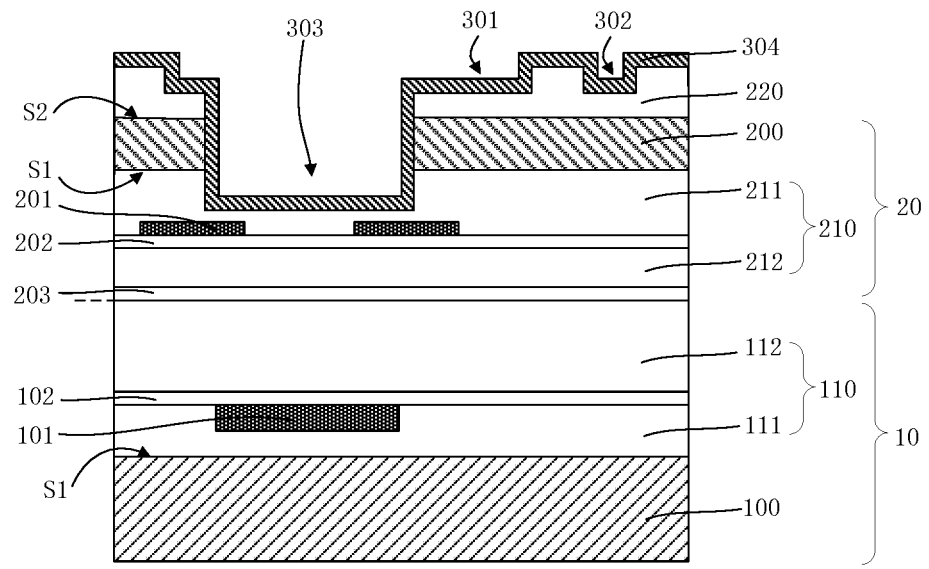

Subsequent to the formation of the first opening 303, an insulating layer 304 is formed, the insulating layer 304 covers the third interlayer dielectric layer 220 as well as sidewalls and bottom surfaces of each of the first trench 301, the wiring layer trench 302 and the first opening 303, as shown in FIG. 14. Example materials from which the insulating layer 304 can be formed may include, but are not limited to, silicon oxide.

Figure 15:
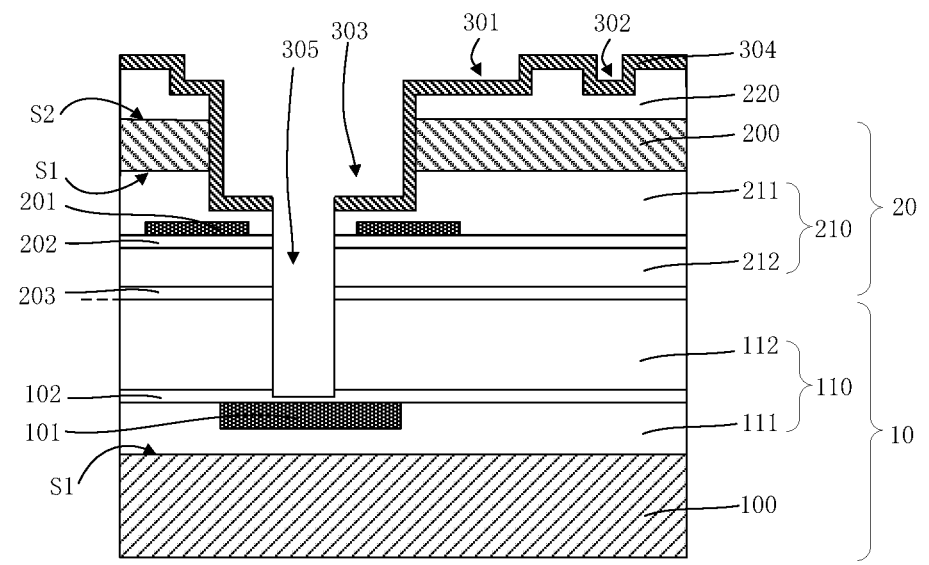

In step S400, as shown in FIGS. 11 and 15, a second opening 305 is formed, the second opening 305 extends through the third interlayer dielectric layer 220, the second semiconductor 20 and a partial thickness of the first semiconductor 10, the second opening 305 is located above the first conductive layer 101 and close to the first conductive layer 101, and the second opening 305 communicates with the first trench 301.

In embodiments hereof, the second opening 305 has an opening size smaller than that of the first opening 303, and a projection of the first opening 303 on the surface of the third interlayer dielectric layer 220 encompasses a projection of the second opening 305 on the same surface of the third interlayer dielectric layer 220.

Specifically, a third photoresist layer (not shown) is formed on the insulating layer 304, which fills the first opening 303, the first trench 301 and the wiring layer trench 302, and is patterned so that a predetermined area where the second opening 305 is to be formed is exposed. Next, with the patterned third photoresist layer as a mask, the insulating layer 304, the third interlayer dielectric layer 220, the second semiconductor 20, the third barrier layer 203, the second interlayer dielectric sub-layer 112 and a partial thickness of the first barrier layer 102 are sequentially etched (i.e., with a thickness of the first barrier layer 102 being remained) so that the second opening 305 is formed. The patterned third photoresist layer is then removed. Of course, the second opening 305 may also be formed by any other suitable approach depending on the depth of the first opening 303, and the present invention is not limited in any way in this regard.

In a preferred embodiment, referring to FIG. 15, the second opening 305 is formed at the bottom of the first opening 303. Specifically, the second opening 305 is formed by performing an etching process at the bottom of the first opening 303, which proceeds sequentially through the insulating layer 304, the second interlayer dielectric layer 210, the third barrier layer 203, the second interlayer dielectric sub-layer 112 and a partial thickness of the first barrier layer 102 and stops within the first barrier layer 102 (i.e., with a thickness of the first barrier layer 102 being remained). As such, the second opening 305 is formed at the bottom of the first opening 303, and the second opening 305 is located above the first conductive layer 101 and close to the first conductive layer 101. The first conductive layer 101 is not exposed in the second opening 305 because it is still covered by the remaining thickness of the first barrier layer 102. In this way, oxidation of the first conductive layer 101 is avoided. Preferably, the opening size of the second opening 305 is smaller than that of the first opening 303. Preferably, the second opening 305 is located between the adjacent two second layer conductive layers 201 whose projections are each overlapped with that of the first conductive layer 101.

Figure 16:
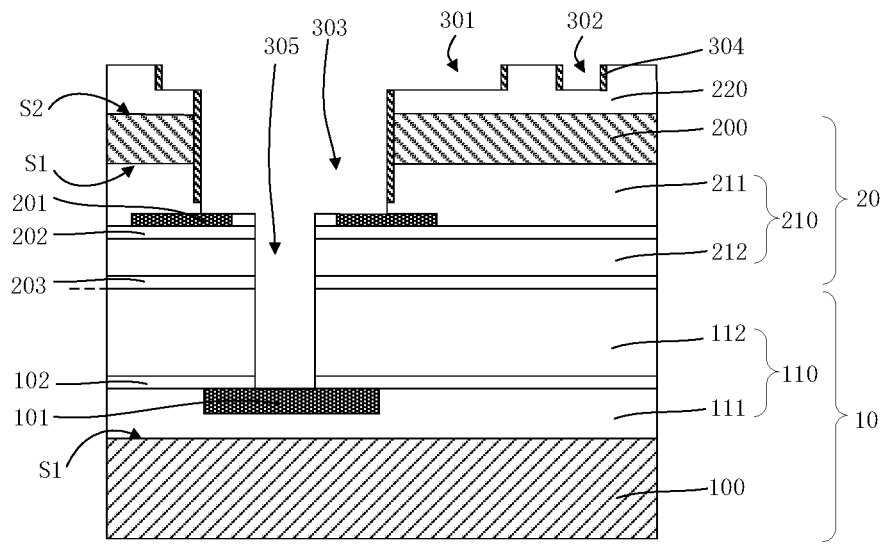

In step S500, referring to FIGS. 11 and 16, the first conductive layer 101 beneath the second opening 305 and the second conductive layers 201 beneath the first opening 303 are exposed. At the time of exposing the first conductive layer 101 beneath the second opening 305 and the second conductive layers 201 beneath the first opening 303, the wiring layer trench 302 may be present in the third interlayer dielectric layer 220.

Specifically, the remaining first barrier layer 102 at the bottom of the second opening 305 is etched away so that the first conductive layer 101 is exposed. In addition, the insulating layer 304 and the third interlayer dielectric sub-layer 211 at the bottom of the first opening 303 are etched away so that the second conductive layers 201 are exposed.

In a preferred embodiment, concurrently with the exposure of the first conductive layer 101 beneath the second opening 305 and the second conductive layers 201 beneath the first opening 303, the insulating layer 304 is exposed at the bottom of the wiring layer trench 302 and a partial thickness of the underlying third interlayer dielectric layer 220 are also removed. However, since a wiring layer is to be subsequently formed in the wiring layer trench 302 by filling it with a conductive material, it is improper to expose the second substrate 200 in the wiring layer trench 302.

Figure 17:
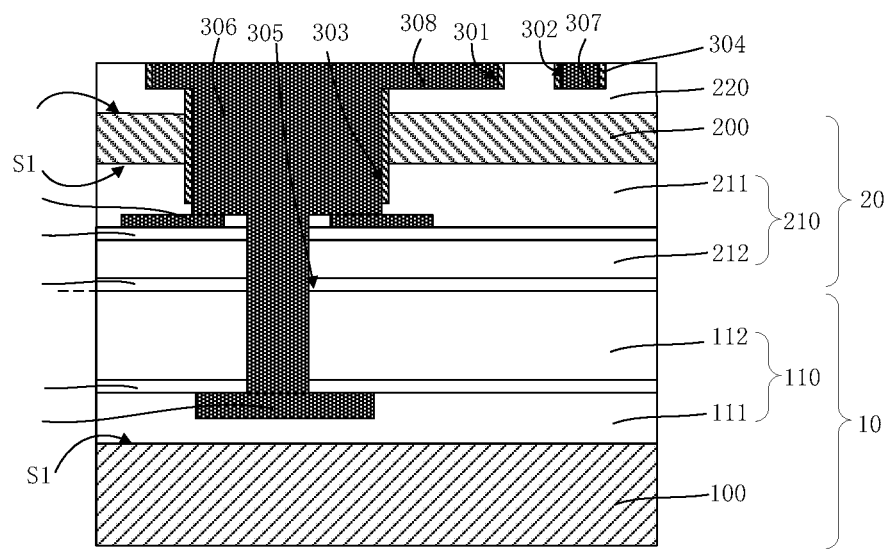

In step S600, as shown in FIGS. 11 and 17, a conductive material is filled in the second opening 305, the first opening 303, the first trench 301 and the wiring layer trench 302 to form a conductive structure 306 and a wiring layer 307.

The conductive material filling the second opening 305, the first opening 303 and the first trench 301 forms the conductive structure 306 that connects the first conductive layer 101 to the second conductive layers 201. Besides this, the conductive material filling the wiring layer trench 302 forms the wiring layer 307. The conductive material is preferred to be a metal such as copper.

According to embodiments of the present invention, the first trench 301 is formed simultaneously with the wiring layer trench 302, before the first and second openings 303, 305 are formed. Additionally, the wiring layer 307 is formed during the formation of the conductive structure 306. Compared to the prior art, this saves the use of two photomasks, leading to savings in production cost. Moreover, according to embodiments of the present invention, the formation of an anti-reflective layer is dispensed with, further reducing production cost.

In the semiconductor device and method provided in the present invention, the first trench 301 is formed simultaneously with the wiring layer trench 302, followed by the formation of the first and second openings 303, 305. After that, the conductive structure 306 is formed simultaneously with the wiring layer 307 by filling a conductive material simultaneously in the second opening 305, the first opening 303, the first trench 301 and the wiring layer trench 302. In this way, it is neither necessary to externally connect the conductive structure by forming an additional opening, nor to form the wiring layer by etching a deposited aluminum layer. This saves the use of two photomasks, leading to savings in cost.

Correspondingly, the present invention also provides a semiconductor device that can be fabricated using the method as defined above. Referring to FIG. 17, the semiconductor device includes:

a first semiconductor 10 and a second semiconductor 20, which are bonded to each other at a bonding interface, the first semiconductor 10 including a first substrate 100, a first interlayer dielectric layer 110 on a front side S1 of the first substrate 100 and a first conductive layer 101 embedded within the first interlayer dielectric layer 110, the second semiconductor 20 including a second substrate 200, a second interlayer dielectric layer 210 on a front side S1 of the second substrate 200 and second conductive layers 201 embedded in the second interlayer dielectric layer 210, wherein a third interlayer dielectric layer 220 is formed on the side of the second semiconductor 20 away from the bonding interface;

a wiring layer trench 302 in the third interlayer dielectric layer 220;

a first trench 301 in the third interlayer dielectric layer 220, the first trench 301 formed simultaneously with the wiring layer trench 302;

a first opening 303 extending through the third interlayer dielectric layer 220 and a partial thickness of the second semiconductor 20, the first opening 303 located above the second conductive layers 201 so that the second conductive layers 201 are exposed in the first opening 303, the first opening 303 in communication with the first trench 301;

a second opening 305 extending through the third interlayer dielectric layer 220, the second semiconductor 20 and a partial thickness of the first semiconductor 10, the second opening 305 situated above the first conductive layer 101 so that the first conductive layer 101 is exposed in the second opening 305, the second opening 305 in communication with the first trench 301; and a conductive material, which is filled partially in the first trench 301, the first opening 303 and the second opening 305 to form a conductive structure 306 that connects the first conductive layer 101 to the second conductive layers 201 and partially in the wiring layer trench 301 to form a wiring layer 307.

Specifically, the first interlayer dielectric layer 110 includes a first interlayer dielectric sub-layer 111 and a second interlayer dielectric sub-layer 112, and the first conductive layer 101 is embedded in the first interlayer dielectric sub-layer 111 so that it extends from an upper surface of the first interlayer dielectric sub-layer 111 into the first interlayer dielectric sub-layer 111. The second interlayer dielectric sub-layer 112 covers both the first conductive layer 101 and the first interlayer dielectric sub-layer 111. A first barrier layer 102 is sandwiched between the first interlayer dielectric sub-layer 111 and the second interlayer dielectric sub-layer 112.

The second interlayer dielectric layer 210 includes a third interlayer dielectric sub-layer 211 and a fourth interlayer dielectric sub-layer 212. The second conductive layers 201 are located above the fourth interlayer dielectric sub-layer 212, and the third interlayer dielectric sub-layer 211 covers both the second conductive layers 201 and the fourth interlayer dielectric sub-layer 212. A second barrier layer 202 is sandwiched between the third interlayer dielectric sub-layer 211 and the fourth interlayer dielectric sub-layer 212, and a third barrier layer 203 is disposed between the second interlayer dielectric sub-layer 112 and the fourth interlayer dielectric sub-layer 212.

The second opening 305 is formed at the bottom of the first opening 303, and the first opening 303 is formed at the bottom of the first trench 301.

A sidewall of the first trench 301, a sidewall of the wiring layer trench 302 and part of a sidewall of the first opening 303 is covered by an insulating layer 304.

In summary, in the metal lead, semiconductor device and methods provided in the present invention, the first trench is formed simultaneously with the wiring layer trench, followed by the formation of the second trench in communication with the first trench. After that, the conductive structure is formed simultaneously with the wiring layer by filling the conductive material simultaneously in the first, second and wiring layer trenches. In this way, it is neither necessary to externally connect the conductive structure by forming an additional opening, nor to form the wiring layer by etching a deposited aluminum layer. This saves the use of two photomasks, leading to savings in cost.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A method of fabricating a metal lead, the method comprising:

providing a semiconductor substrate and simultaneously forming therein a first trench and a wiring layer trench, wherein each of the first trench and the wiring layer trench extends from a surface of the semiconductor substrate into the semiconductor substrate;

forming a second trench, which extends from the surface of the semiconductor substrate into the semiconductor substrate and communicates with the first trench; and forming a conductive structure and a wiring layer by filling the first trench, the second trench and the wiring layer trench with a conductive material, wherein the second trench comprises a third depression and a third opening, the third depression formed at a bottom of the first trench, the third opening formed at a bottom of the third depression, the third opening having an opening size that is smaller than an opening size of the third depression, the opening size of the third depression being smaller than an opening size of the first trench.

2. The method of fabricating a metal lead of claim 1, wherein a depth of the second trench extending from the surface of the semiconductor substrate into the semiconductor substrate is greater than a depth of the first trench extending from the surface of the semiconductor substrate into the semiconductor substrate, and wherein the first trench and the second trench together form a Damascus structure.

3. The method of fabricating a metal lead of claim 1, wherein the first trench has a depth equal to a depth of the wiring layer trench.

4. The method of fabricating a metal lead of claim 1, wherein the second trench has an opening size smaller than the opening size of the first trench.

5. The method of fabricating a metal lead of claim 4, wherein a projection of the first trench on the surface of the semiconductor substrate encompasses a projection of the second trench on the surface of the semiconductor substrate.

6. A method of fabricating a semiconductor device, the method comprising:

providing a first semiconductor and a second semiconductor bonded to the first semiconductor, the second semiconductor bonded to the first semiconductor and forming a bonding interface at a bonding position, the first semiconductor comprising a first substrate, a first interlayer dielectric layer on a front side of the first substrate and a first conductive layer embedded in the first interlayer dielectric layer, the second semiconductor comprising a second substrate, a second interlayer dielectric layer on a front side of the second substrate and a second conductive layer embedded in the second interlayer dielectric layer, wherein a third interlayer dielectric layer is formed on a side of the second semiconductor away from the bonding interface;

simultaneously forming a first trench and a wiring layer trench, the first trench and the wiring layer trench respectively formed in the third interlayer dielectric layer;

forming a first opening extending through the third interlayer dielectric layer and a partial thickness of the second semiconductor, the first opening situated above the second conductive layer, the first opening in communication with the first trench;

forming a second opening extending through the third interlayer dielectric layer, the second semiconductor and a partial thickness of the first semiconductor, the second opening situated above the first conductive layer, the second opening in communication with the first trench;

exposing the first conductive layer beneath the second opening and the second conductive layer beneath the first opening; and forming a conductive structure and a wiring layer by filling the first trench, the first opening, the second opening and the wiring layer trench with a conductive material, wherein during exposing the first conductive layer beneath the second opening and the second conductive layer beneath the first opening, the wiring layer trench is located in the third interlayer dielectric layer.

7. The method of fabricating a semiconductor device of claim 6, wherein the first opening has an opening size smaller than an opening size of the first trench, and wherein a projection of the first trench on a surface of the third interlayer dielectric layer encompasses a projection of the first opening on the surface of the third interlayer dielectric layer.

8. The method of fabricating a semiconductor device of claim 7, wherein the second opening has an opening size smaller than the opening size of the first opening, and wherein the projection of the first opening on the surface of the third interlayer dielectric layer encompasses a projection of the second opening on the surface of the third interlayer dielectric layer.

9. The method of fabricating a semiconductor device of claim 6, further comprising, subsequent to the formation of the first opening and prior to the formation of the second opening, forming an insulating layer covering sidewalls and bottom surfaces of the first trench, the first opening and the wiring layer trench.

\* \* \* \* \*